United States Patent
Lin et al.

(10) Patent No.: US 11,608,843 B2
(45) Date of Patent: Mar. 21, 2023

(54) PHOTOVOLTAIC MODULE CONNECTION MECHANICAL PART

(71) Applicant: Huawei Digital Power Technologies Co., Ltd., Shenzhen (CN)

(72) Inventors: Yisen Lin, Shenzhen (CN); Weilong Zhang, Xi'an (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 119 days.

(21) Appl. No.: 16/789,787

(22) Filed: Feb. 13, 2020

(65) Prior Publication Data

US 2020/0186078 A1  Jun. 11, 2020

Related U.S. Application Data

(63) Continuation of application No. PCT/CN2018/100578, filed on Aug. 15, 2018.

(30) Foreign Application Priority Data

Aug. 15, 2017 (CN) .......................... 201710697389.3

(51) Int. Cl.
*F16B 2/10* (2006.01)
*H02S 40/30* (2014.01)

(52) U.S. Cl.
CPC ................ *F16B 2/10* (2013.01); *H02S 40/30* (2014.12)

(58) Field of Classification Search
CPC .......... H02S 40/00; H02S 40/32; H02S 40/34; H02S 30/10; H02S 20/30; H02S 40/30;
(Continued)

(56) References Cited

U.S. PATENT DOCUMENTS 4,190,224 A * 2/1980 LeBlanc .................. A61G 5/10
248/227.3
6,019,524 A * 2/2000 Arbuckle ............... F16M 11/18
248/346.06
(Continued)

FOREIGN PATENT DOCUMENTS

CN 2798858 Y 7/2006
CN 202513171 U 10/2012
(Continued)

*Primary Examiner* — Jonathan Liu
*Assistant Examiner* — Guang H Guan
(74) *Attorney, Agent, or Firm* — Womble Bond Dickinson (US) LLP

(57) ABSTRACT

This application provides a connection mechanical part of a photovoltaic module. The connection mechanical part includes: a first connection assembly and a second connection assembly, wherein the first connection assembly and the second connection assembly each include a connection part, a mounting part and a hinge mounting part between the connection part and the mounting part; the first connection assembly and the second connection assembly are hinge-connected to each other by using their respective hinge mounting parts; the connection part of the first connection assembly is disposed opposite to the connection part of the second connection assembly; and a tensioning device is further disposed between the first connection assembly and the second connection assembly, where the connection parts of the first connection assembly and the second connection assembly are attached or detached by adjusting the tensioning device, to connect the connection mechanical part to the photovoltaic module.

8 Claims, 5 Drawing Sheets

(58) Field of Classification Search
CPC ... F16B 2/10; B25B 5/103; B25B 1/10; B25B 1/103; B25B 5/04; B25B 5/10; B25B 5/104; Y10T 24/44504
USPC .... 248/229.13, 229.23, 228.4, 230.4, 231.51
See application file for complete search history.

(56) References Cited

U.S. PATENT DOCUMENTS

| | | | | |
|---|---|---|---|---|
| 7,243,402 | B2* | 7/2007 | Andersen | B60P 7/0807 |
| | | | | 24/517 |
| 8,826,606 | B2* | 9/2014 | Yen | F16B 5/0635 |
| | | | | 52/173.3 |
| 9,299,870 | B2* | 3/2016 | Kuan | H01L 31/048 |
| 9,351,565 | B2* | 5/2016 | Torrachi | F16B 2/065 |
| 9,777,948 | B2* | 10/2017 | Braunstein | H02S 20/23 |
| 10,284,104 | B2* | 5/2019 | Kim | H02S 40/32 |
| 10,312,855 | B2* | 6/2019 | Lester | G05F 1/67 |
| 11,143,220 | B2* | 10/2021 | Betcher | F16B 2/10 |
| 2008/0283118 | A1* | 11/2008 | Rotzoll | H02S 40/32 |
| | | | | 136/251 |
| 2013/0133270 | A1 | 5/2013 | West et al. | |
| 2014/0077055 | A1 | 3/2014 | Hamilton | |
| 2014/0182662 | A1 | 7/2014 | West et al. | |
| 2016/0268965 | A1* | 9/2016 | Stearns | H02S 40/32 |
| 2017/0207743 | A1* | 7/2017 | Lemos | H02S 20/20 |
| 2020/0186078 | A1* | 6/2020 | Lin | H02S 30/10 |

FOREIGN PATENT DOCUMENTS

| | | |
|---|---|---|
| CN | 203225255 U | 10/2013 |
| CN | 204720435 U | 10/2015 |
| CN | 105563377 A | 5/2016 |
| CN | 206272562 U | 6/2017 |
| CN | 107579705 A | 1/2018 |

\* cited by examiner

PHOTOVOLTAIC MODULE CONNECTION MECHANICAL PART

CROSS-REFERENCE TO RELATED APPLICATIONS

This application is a continuation of International Application No. PCT/CN2018/100578, filed on Aug. 15, 2018, which claims priority to Chinese Patent Application No. 201710697389.3, filed on Aug. 15, 2017, the disclosures of which are incorporated herein by reference in their entireties.

TECHNICAL FIELD

This application relates to the field of photovoltaic power generation device technologies, and in particular, to a photovoltaic module connection mechanical part.

BACKGROUND

A photovoltaic module (also referred to as a solar panel) is a core part of a solar power system. A solar cell is a semiconductor device that converts light into electricity. The solar cell can convert solar radiation energy on its surface into a direct current, and store the direct current into a battery, or convert the direct current into an alternating current by using an inverter and feed the alternating current into a power generation system.

In the prior art, the solar panel further includes an optimizer. The optimizer is connected in series between an output line of the solar panel and the inverter. As a crucial device in a photovoltaic system, the optimizer can optimize a photovoltaic circuit, and perform a maximum power point tracking (MPPT) operation. In a scenario in which there are no other mounting brackets on the photovoltaic module, the optimizer needs to be installed and fastened on a frame of the photovoltaic module.

There are many types of frame specifications for the photovoltaic module. Common photovoltaic module frames of the following specifications are used in the market: widths of 30 mm, 35 mm, 40 mm, and the like. When the optimizer is installed on the frame of the photovoltaic module, different mounting kits need to be used for frames of different specifications, or the frame needs to be modified based on its characteristics before the optimizer can be installed and fastened. As a result, design and manufacturing costs are high, and onsite installation efficiency is decreased.

SUMMARY

Specific embodiments of this application provide a connection mechanical part of a photovoltaic module, to facilitate a connection between the photovoltaic module and an optimizer.

According to one aspect, this application provides a photovoltaic module connection mechanical part, where the connection mechanical part is configured to connect a photovoltaic module to an optimizer, and the optimizer is fastened to the connection mechanical part; the connection mechanical part includes: a first connection assembly and a second connection assembly, where the first connection assembly includes a first connection part and a first mounting part, and the second connection assembly includes a second connection part and a second mounting part; the first connection assembly includes a first hinge mounting part between the first connection part and the first mounting part, and the second connection assembly includes a second hinge mounting part between the second connection part and the second mounting part; the first connection assembly and the second connection assembly are hinge-connected by using the first hinge mounting part and the second hinge mounting part, and the first connection part of the first connection assembly is disposed opposite to the second connection part of the second connection assembly; and a tensioning device is further disposed between the first connection assembly and the second connection assembly.

In one embodiment, the connection parts of the first connection assembly and the second connection assembly are attached or detached by adjusting the tensioning device, to connect the connection mechanical part to the photovoltaic module. The hinged connection between the first connection assembly and the second connection assembly allows a simpler connection between the connection mechanical part and the photovoltaic module, and this improves installation efficiency.

In one embodiment, the hinge mounting part of the first connection assembly further includes a mounting groove, a notch is further disposed on each of two sides of the second hinge mounting part, and the mounting groove matches the second hinge mounting part.

In one embodiment, the first connection assembly and the second connection assembly are hinge-connected to each other by using their respective hinge mounting parts includes: when the first hinge mounting part and the second hinge mounting part have a common axis, the first connection assembly and the second connection assembly are hinge-connected to each other by using their respective hinge mounting parts.

In one embodiment, the tensioning device includes a regulating rod and a regulating end, the regulating end is fastened to one end of the regulating rod, and the regulating rod is externally threaded; the first connection part or the second connection part is internally threaded to match the externally-threaded regulating rod.

In one embodiment, the connection mechanical part is clamped to or detached from the photovoltaic module by adjusting a relative position of the regulating rod on the first connection assembly or the second connection assembly. A simpler connection is achieved between the photovoltaic module and the connection mechanical part by using a nut to adjust the connection.

In one embodiment, the hinge mounting part of the first connection assembly further includes a mounting hole, and the mounting hole matches the hinge mounting part of the second connection assembly.

In one embodiment, the first connection assembly and the second connection assembly are hinge-connected to each other by using their respective hinge mounting parts.

In one embodiment, when the hinge mounting part of the second connection assembly passes through the mounting hole of the first connection assembly, the first connection assembly and the second connection assembly are hinge-connected to each other by using their respective hinge mounting parts.

In one embodiment, the tensioning device includes a fastening end, a regulating end, and a connecting bar; the fastening end is fastened to the connecting bar, and the connecting bar passes through the mounting parts of the first connection assembly and the second connection assembly.

In one embodiment, one side that is of the connecting bar and that is away from the fastening end is threaded.

In one embodiment, the regulating end is thread-connected to the connecting bar; and the connection mechanical part is clamped to or detached from the photovoltaic module by adjusting a position of the regulating end on the connecting bar. A simpler connection is achieved between the photovoltaic module and the connection mechanical part by using a nut to adjust the connection.

In one embodiment, an outer diameter of the fastening end is a polygon.

In one embodiment, one side that is of the first connection assembly and that is away from the second connection assembly or one side that is of the second connection assembly and that is away from the first connection part includes a countersunk hole that fits the outer diameter of the fastening end.

In one embodiment, the fastening end is disposed in the countersunk hole by adjusting a relative position of the regulating end on the connecting bar. The polygon fastening end and the countersunk hole matching the fastening end are disposed, to facilitate adjustment of the tensioning device.

In one embodiment, the regulating end is a flange nut. The provided flange nut passes through a non-conducting layer on a surface of the optimizer, to enable the optimizer disposed on the flange nut and the connection part to be grounded.

In one embodiment, toothed protrusions are disposed on one side that is of the first mounting part of the first connection assembly and that faces the second connection assembly, and on one side that is of the second mounting part of the second connection assembly and that faces the first connection assembly. The provided toothed protrusions pass through a non-conducting layer on a surface of a frame of the photovoltaic module, to enable the connection mechanical part to be conductively connected to the frame of the photovoltaic module, so as to ground the optimizer.

In one embodiment, pointed protrusions are disposed on one side that is of the first mounting part of the first connection assembly and that faces the second connection assembly, and on one side that is of the second mounting part of the second connection assembly and that faces the first connection assembly. The provided pointed protrusions pass through a non-conducting layer on a surface of a frame of the photovoltaic module, to enable the connection mechanical part to be conductively connected to the frame of the photovoltaic module, so as to ground the optimizer.

In one embodiment, the connection part of the first connection assembly or the second connection assembly includes an extension part and a fastening clip; the fastening clip is disposed at an end of the extension part; and a sum of lengths of the extension part and the mounting part is the same as a length of a frame of the photovoltaic module. The provided extension part and fastening clip ensure a stabler connection between the connection mechanical part and the frame of the photovoltaic module, and between the connection mechanical part and the optimizer.

In one embodiment, toothed protrusions are disposed on an extension part.

In one embodiment, pointed protrusions are disposed on an extension part.

The provided toothed or pointed protrusions pass through a non-conducting layer on a surface of a frame of the photovoltaic module, to enable the connection mechanical part to be conductively connected to the frame of the photovoltaic module, so as to ground the optimizer.

DESCRIPTION OF EMBODIMENTS

To make the objectives, technical solutions, and advantages of this application clearer, the following clearly describes the technical solutions in this application with reference to specific embodiments and accompanying drawings in this application. Apparently, the described embodiments are merely some but not all of the embodiments of this application. All other embodiments obtained by a person of ordinary skill in the art based on the embodiments of this application without creative efforts shall fall within the protection scope of this application.

The following describes the technical solutions provided in the embodiments of this application in detail with reference to the accompanying drawings.

Figure 1:
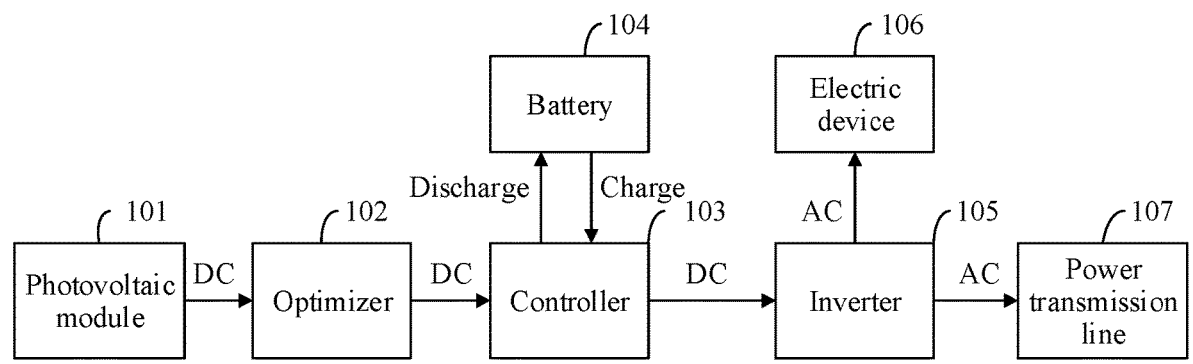
FIG. 1 shows a solar energy storage system according to one embodiment.

FIG. 1 shows a solar energy storage system according to one embodiment. The system includes a photovoltaic module 101, an optimizer 102, a controller 103, a battery 104, and an inverter 105.

Figure 2:
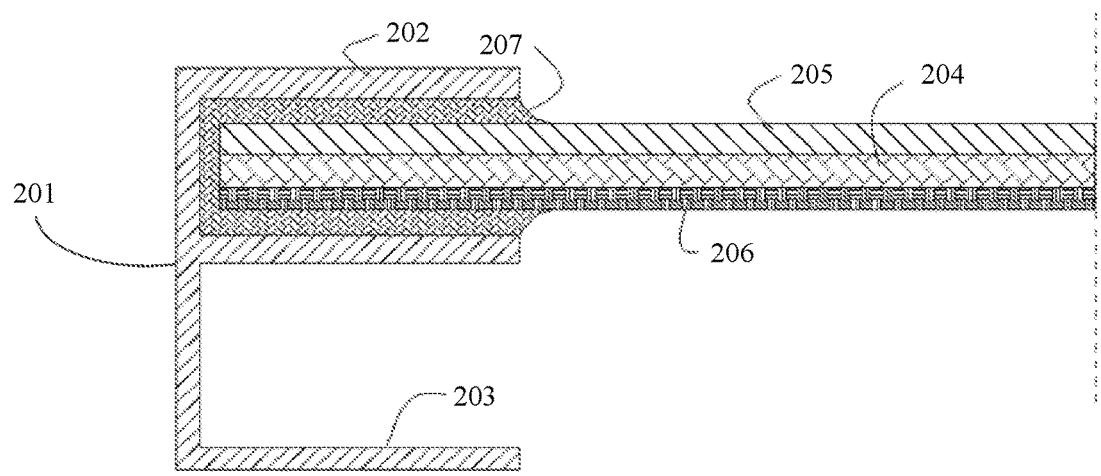
FIG. 2 is a cross-sectional diagram of a structure of a photovoltaic module according to one embodiment.

The photovoltaic module 101 converts solar energy into electric energy. In one example, FIG. 2 is a cross-sectional diagram of a structure of a photovoltaic module according to one embodiment. As shown in FIG. 2, the photovoltaic module includes a frame 201, a solar cell 204, a back plate 206, and cover glass 205. Disposed on a rear side of the solar cell 204, the back plate 206 is configured to support the solar cell 204. Disposed on a front side of the solar cell 204, the cover glass 205 is configured to protect the solar cell 204 from being damaged. A glue layer is further provided between the cover glass 205 and the solar cell 204. The glue layer is configured to bond the solar cell 204 and the cover glass 205. The frame 201 of a variety of specifications, such as 30 mm, 35 mm, and 40 mm, is provided based on dimensions of the solar cell 204. The frame includes a fastening area 202 and a connection area 203. The fastening area 202 is of a C-type structure. The fastening area 202 is configured to fasten the cover glass 205, the solar cell 204, and the back plate 206. A filling layer 207 is further provided in the fastening area 202. The filling layer 207 is configured to fasten the cover glass 205, the solar cell 204, and the back plate 206 within the frame 201. The connection area 203 is configured to fasten the photovoltaic module to another object.

The optimizer 102 is fastened in the connection area 203 of the photovoltaic module 101. The optimizer 102 is configured to receive a direct current output by the photovoltaic module 101, optimize a photovoltaic circuit, and perform a maximum power point tracking (MPPT) operation. The controller 103 is configured to control a circuit connection to the battery 104, or control a circuit connection to the inverter 105. The inverter 105 is configured to convert an incoming direct current into an alternating current and output the alternating current. The inverter may be connected to an electric device 106, a power transmission line 107, or the like, to directly use the electric energy or transmit the electric energy.

Figure 3:
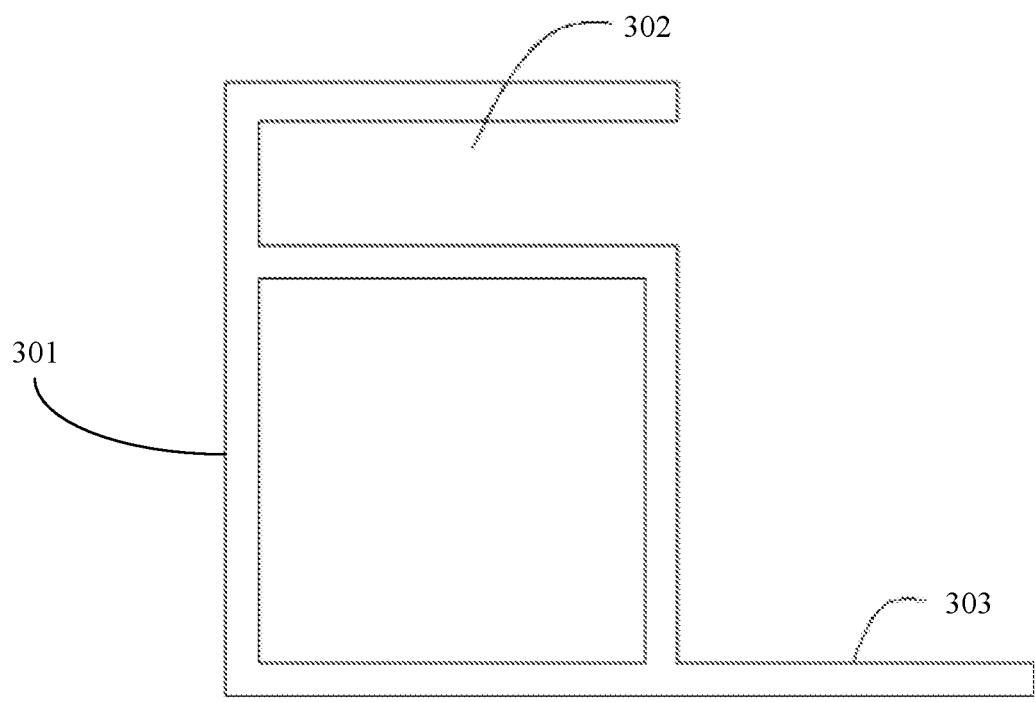
FIG. 3 shows a frame of a photovoltaic module according to one embodiment.

In one embodiment, the frame 201 of the photovoltaic module 101 may be of any structure, for example, a frame of a photovoltaic module shown in FIG. 3. The frame 301 includes a fastening area 302 and a connection area 303. The fastening area 302 and the connection area 303 have same functions as those of the fastening area 202 and the connection area 203 shown in FIG. 2.

The connection mechanical part provided in the embodiment of this application is configured to connect the photovoltaic module and an optimizer. The connection mechanical part includes a first connection assembly and a second connection assembly. The first connection assembly and the second connection assembly each include a connection part and a mounting part. The first connection assembly and the second connection assembly each include a hinge mounting part between the connection part and the mounting part. The first connection assembly and the second connection assembly are hinge-connected by using their respective hinge mounting parts, and the connection part of the first connection assembly is disposed opposite to the connection part of the second connection assembly. A tensioning device is further disposed between the first connection assembly and the second connection assembly. The connection parts of the first connection assembly and the second connection assembly are attached or detached by adjusting the tensioning device, to connect the connection mechanical part to the photovoltaic module.

The optimizer is clamped onto the photovoltaic module, and the optimizer is fastened on the connection mechanical part. The connection mechanical part is clamped to the photovoltaic module. Therefore, this avoids inconvenience caused by a complex structure during installation.

Figure 4:
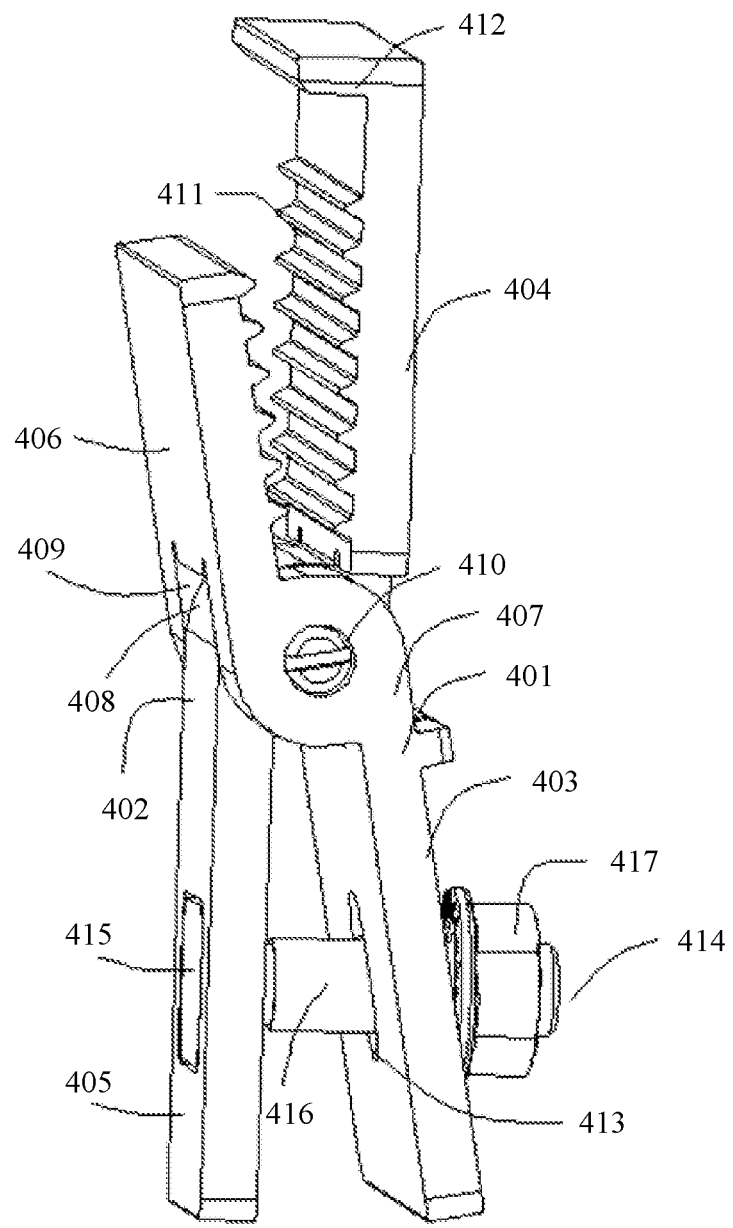
FIG. 4 shows a connection mechanical part of a photovoltaic module according to one embodiment.

In one example, FIG. 4 shows a connection mechanical part of a photovoltaic module according to one embodiment. As shown in FIG. 4, the connection mechanical part includes a first connection assembly 401 and a second connection assembly 402. The first connection assembly 401 includes a first connection part 403 and a first mounting part 406, and the second connection assembly 402 includes a second connection part 405 and a second mounting part 404. A first hinge mounting part 407 is disposed between the first connection part 403 and the first mounting part 406, and a second hinge mounting part 408 is disposed between the second connection part 405 and the second mounting part 404. The first connection assembly 401 and the second connection assembly 402 are hinge-connected by using the first hinge mounting part 407 and the second hinge mounting part 408.

The following describes in detail a hinge connection structure between the first connection assembly 401 and the second connection assembly 402.

The first hinge mounting part 407 further includes a mounting groove 409. A width of the mounting groove 409 is the same as that of the second hinge mounting part 408. A connection hole is further disposed on each of the first hinge mounting part 407 and the second hinge mounting part 408. When the second hinge mounting part 408 is disposed in the mounting groove 409 of the first hinge mounting part 407, the connection holes on the first hinge mounting part 407 and the second hinge mounting part 408 have a common axis. A connecting shaft 410 is disposed in the connection holes on the first hinge mounting part 407 and the second hinge mounting part 408, so that the first connection assembly 401 is hinge-connected to the second connection assembly 402.

To fasten the connection mechanical part to a connection area of a frame of the photovoltaic module, a tensioning device 414 is further disposed on the first connection part 403 and the second connection part 405. The tensioning device 414 is configured to tighten the first mounting part 406 and the second mounting part 404. The tensioning device 414 includes a connecting bar 416 and a regulating end 417. The connecting bar 416 passes through mounting holes 413 in the first connection part 403 and the second connection part 405. The regulating end 417 is internally threaded, and the connecting bar 416 is externally threaded. The internally-threaded regulating end 417 matches the externally-threaded connecting bar 416. The connection mechanical part is fastened to or loosened from the connection area by adjusting a position of the fastening end 417 on the connecting bar 416.

In this embodiment, a fastening end 415 is further disposed on one side that is of the connecting bar 416 and that is away from the regulating end 417. The fastening end 415 is an integral part of the connecting bar 416. One surface that is of the first connection part 403 and that is away from the second connection part 405 or one side that is of the second connection part 405 and that is away from the first connection part 403 includes a countersunk hole. The fastening end is disposed in the countersunk hole by adjusting a relative position of the regulating end on the connecting bar.

Further, an outer diameter of the fastening end 415 is a polygon. The countersunk hole fits the outer diameter of the fastening end.

Further, the regulating end 417 is a nut. The nut is a flange nut. The flange nut is used on the regulating end 417, to tighten a connection of the tensioning device, and avoid that the connection area between the connection mechanical part and the frame of the photovoltaic module is loose due to a movement of the regulating end 417.

In this embodiment, toothed protrusions 411 are disposed on one surface that is of the first mounting part 406 and that faces the second mounting part 404, and on one surface that is of the second mounting part 404 and that faces the first mounting part 406. The toothed protrusions 411 are disposed on the first mounting part 406 and the second mounting part 404, so that the connection mechanical part is more closely connected to the connection area of the frame of the photovoltaic module, to avoid a loose connection during use of the connection mechanical part.

In the foregoing embodiment, an optimizer may be fastened between the first connection part 403 and the regulating end 417. The photovoltaic module and the optimizer are used outdoor. Surfaces of the frame of the photovoltaic module and a housing of the optimizer are anodized, to meet anti-corrosion, anti-moisture, and anti-mildew requirements. A surface after anodizing is non-conductive. In an example in which the photovoltaic module and the optimizer need to be grounded, the frame of the photovoltaic module is grounded. The flange nut passes through the surface of the optimizer and the mounting part with the toothed protrusions is used, so that the optimizer is conductively connected to the connection mechanical part and the connection mechanical part is conductively connected to the frame of the photovoltaic module, to ground the optimizer.

In one embodiment, the first mounting part or the second mounting part further includes an extension part (e.g., extension part 412) and a fastening clip. The fastening clip is disposed at an end of the extension part. The fastening clip is configured to further fasten the connection mechanical part to the frame of the photovoltaic module. A sum of lengths of the extension part and the mounting part is the same as a length of a frame of a photovoltaic module of the largest standard specifications.

Further, the extension part is movably disposed on the connection part. A position of the extension part on the connection part may be adjusted based on an actual requirement. It should be noted that a specific connection manner of the connection part or the extension part is not limited in the specific embodiment of this application. Any solution can be used to connect the connection part and the extension part as long as their positions can be adjusted and they can be fastened.

Figure 5:
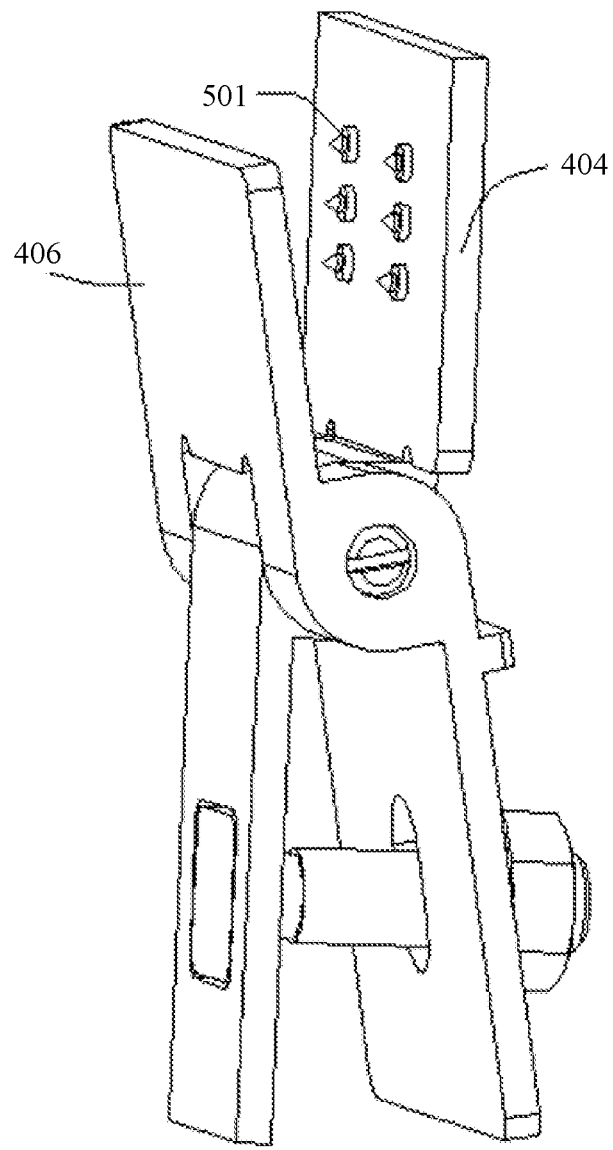
FIG. 5 shows another connection mechanical part according to one embodiment.

FIG. 5 shows another connection mechanical part according to one embodiment. The connection mechanical part shown in FIG. 5 is similar to that shown in FIG. 4. The difference lies in that pointed protrusions 501 are disposed on one surface that is of the first mounting part 406 and that faces the second mounting part 404, and on one surface that is of the second mounting part 404 and that faces the first mounting part 406. The pointed protrusions 501 are disposed on the first mounting part 406 and the second mounting part 404, so that the connection mechanical part is more closely connected to the connection area of the frame of the photovoltaic module, to avoid a loose connection during use of the connection mechanical part.

Figure 6:
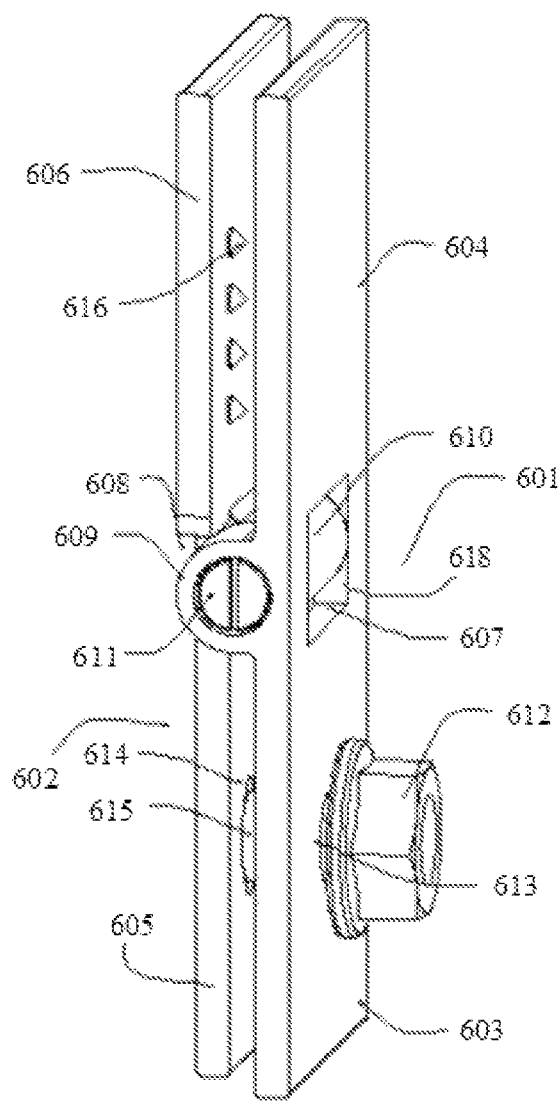
FIG. 6 shows a second connection mechanical part according to one embodiment.

FIG. 6 shows a second connection mechanical part according to one embodiment. As shown in FIG. 6, the connection mechanical part includes a first connection assembly 601 and a second connection assembly 602. The first connection assembly 601 includes a first connection part 603 and a first mounting part 604, and the second connection assembly 602 includes a second connection part 605 and a second mounting part 606. A first hinge mounting part 609 is disposed between the first connection part 603 and the first mounting part 604, and a second hinge mounting part 610 is disposed between the second connection part 605 and the second mounting part 606. The first connection assembly 601 and the second connection assembly 602 are hinge-connected by using the first hinge mounting part 609 and the second hinge mounting part 610.

The following describes in detail a hinge connection structure between the first connection assembly 601 and the second connection assembly 602.

The first hinge mounting part 609 further includes a mounting groove 607. A notch 608 is disposed on each of two sides of the second hinge mounting part 610, and is disposed on each of two sides of the whole second connection part 605. A width of the mounting groove 607 is the same as a width obtained after the notch 608 is removed from the second hinge mounting part 610. When the second hinge mounting part 610 is disposed in the mounting groove 607 of the first hinge mounting part 609, and the first hinge mounting part 609 and the second hinge mounting part 610 have a common axis, the first connection assembly 601 and the second connection assembly 602 are hinge-connected to each other by using a connection shaft 611. As shown in FIG. 6, the mounting groove 607 may include an open end 618 with an enclosed perimeter on an outer side of the first connection assembly 601, and the outer side of the first connection assembly 601 may face away from the second connection assembly 602.

To fasten the connection mechanical part to a connection area of a frame of the photovoltaic module, a tensioning device is further disposed on the first connection part 603 and the second connection part 605. The tensioning device is configured to tighten the first mounting part 604 and the second mounting part 606. The tensioning device includes a regulating rod 615 and a regulating end 612. The regulating end 612 is fastened to one end of the regulating rod 615. An outer diameter of the regulating rod 615 is threaded. The first connection part 603 or the second connection part 605 is internally threaded to match the externally-threaded regulating rod 615. The regulating rod 615 is adjusted, and an extension end of the regulating rod 615 controls the first mounting part 604 of the connection mechanical part to be clamped to or detached from the second mounting part 606.

In this embodiment, the first connection part 603 further includes a positioning hole 613 and the second connection part 605 further includes a positioning hole 614. The positioning holes 613-614 are configured to position the regulating rod 615 when the regulating rod 615 moves.

Further, an outer diameter of the regulating end 612 is a polygon.

Further, the regulating end 612 is a flange nut. The flange nut is used on the regulating end 612, to tighten a connection of the tensioning device, and avoid that the connection area between the connection mechanical part and the frame of the photovoltaic module is loose due to a movement of the regulating end 612.

In this embodiment, toothed or pointed protrusions 616 are disposed on one surface that is of the first mounting part 604 and that faces the second mounting part 606, and on one surface that is of the second mounting part 606 and that faces the first mounting part 604. The toothed or pointed protrusions 616 are disposed on the first mounting part 604 and the second mounting part 606, so that the connection mechanical part is more closely connected to the connection area of the frame of the photovoltaic module, to avoid a loose connection during use of the connection mechanical part.

In the foregoing embodiment, an optimizer may be fastened between the first connection part 603 and the regulating end 612. The photovoltaic module and the optimizer are used outdoor. Surfaces of the frame of the photovoltaic module and a housing of the optimizer are anodized, to meet anti-corrosion, anti-moisture, and anti-mildew requirements. A surface after anodizing is non-conductive. In an example in which the photovoltaic module and the optimizer need to be grounded, the frame of the photovoltaic module is grounded. The flange nut passes through the surface of the optimizer and the mounting part with the toothed protrusions is used, so that the optimizer is conductively connected to the connection mechanical part and the connection mechanical part is conductively connected to the frame of the photovoltaic module, to ground the optimizer.

It should be noted that the foregoing connection mechanical part in this embodiment of this application may also include an extension part and a fastening clip.

It should further be noted that the terms "include", "comprise", or any other variant thereof are intended to cover a non-exclusive inclusion, so that a commodity or a device that includes a list of elements not only includes those elements but also includes other elements that are not expressly listed, or further includes elements inherent to such a commodity or device. An element preceded by "includes a . . . " does not, without more constraints, preclude the presence of additional identical elements in the commodity or device that includes the element.

The foregoing descriptions are merely embodiments of this application, and are not intended to limit this application. For a person skilled in the art, this application may have various modifications and variations. Any modification, equivalent replacement, or improvement made without departing from the principle of this application shall fall within the claims scope of this application.

What is claimed is:

1. A connection mechanical part of a photovoltaic module connected to an optimizer through the connection mechanical part, with the optimizer being fastened to the connection mechanical part, the connection mechanical part comprising:
- a first connection assembly comprising a first connection part, a first mounting part, and a first hinge mounting part between the first connection part and the first mounting part;
- a second connection assembly comprising a second connection part, a second mounting part, and a second hinge mounting part between the second connection part and the second mounting part; and
- a tensioning device disposed between the first connection part and the second connection part;
- wherein the first connection assembly and the second connection assembly are hinge-connected by using the first hinge mounting part and the second hinge mounting part, and the first connection part is disposed opposite to the second connection part;
- wherein the first hinge mounting part comprises a mounting groove that matches the second hinge mounting part, the second hinge mounting part is disposed in the mounting groove, the mounting groove comprises an open end with an enclosed perimeter on an outer side of the first connection assembly, and the outer side of the first connection assembly faces away from the second connection assembly;
- wherein the tensioning device is adjustable to move the first mounting part and the second mounting part toward one another to connect the connection mechanical part to a connection area of the photovoltaic module or move the first mounting part and the second mounting part away from one another to disconnect the connection mechanical part from the connection area of the photovoltaic module.

2. The connection mechanical part according to claim 1, wherein the second connection assembly defines two notches each disposed on a respective one of two sides of the second hinge mounting part.

3. The connection mechanical part according to claim 2, wherein the first connection assembly and the second connection assembly are hinge-connected to each other by a connection shaft.

4. The connection mechanical part according to claim 2, wherein
- the tensioning device comprises a regulating rod that is externally threaded, and a regulating end fastened to one end of the regulating rod;
- the first connection part or the second connection part is internally threaded to match the regulating rod.

5. The connection mechanical part according to claim 4, wherein a relative position of the regulating rod on the first connection assembly or the second connection assembly is adjustable to facilitate clamping of the connection mechanical part to the connection area of the photovoltaic module or facilitate detachment of the connection mechanical part from the connection area of the photovoltaic module.

6. The connection mechanical part according to claim 4, wherein the regulating end is a flange nut.

7. The connection mechanical part according to claim 1, wherein
- a first plurality of toothed protrusions are disposed on a surface that is of the first mounting part of the first connection assembly and that faces the second connection assembly, and
- a second plurality of toothed protrusions are disposed on a surface that is of the second mounting part of the second connection assembly and that faces the first connection assembly.

8. The connection mechanical part according to claim 1, wherein
- a first plurality of pointed protrusions are disposed on a surface that is of the first mounting part of the first connection assembly and that faces the second connection assembly, and
- a second plurality of pointed protrusions are disposed on a surface that is of the second mounting part of the second connection assembly and that faces the first connection assembly.

* * * * *

UNITED STATES PATENT AND TRADEMARK OFFICE
CERTIFICATE OF CORRECTION

PATENT NO. : 11,608,843 B2
APPLICATION NO. : 16/789787
DATED : March 21, 2023
INVENTOR(S) : Yisen Lin and Weilong Zhang Page 1 of 1

It is certified that error appears in the above-identified patent and that said Letters Patent is hereby corrected as shown below:

On the Title Page

In item (73) the Assignee section, delete "HUAWEI TECHNOLOGIES CO., LTD., Guangdong (CN)" and insert --Huawei Digital Power Technologies Co., Ltd., Shenzhen (CN)--.

Signed and Sealed this
Tenth Day of December, 2024

Katherine Kelly Vidal
*Director of the United States Patent and Trademark Office*